United States Patent
Kosakai et al.

(12) 
(10) Patent No.: US 12,135,659 B2
(45) Date of Patent: Nov. 5, 2024

(54) COMMUNICATION IN ACCORDANCE WITH MULTIPLE INTERFACE PROTOCOLS IN SEMICONDUCTOR STORAGE DEVICE

(71) Applicant: KIOXIA CORPORATION, Tokyo (JP)

(72) Inventors: Mitsuhiko Kosakai, Fujisawa Kanagawa (JP); Masashi Uchino, Yokohama Kanagawa (JP); Fazul Kareem, Yokohama Kanagawa (JP); Keisuke Takahashi, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 282 days.

(21) Appl. No.: 17/403,582

(22) Filed: Aug. 16, 2021

(65) Prior Publication Data

US 2022/0300436 A1    Sep. 22, 2022

(30) Foreign Application Priority Data

Mar. 19, 2021    (JP) .................................. 2021-046108

(51) Int. Cl.
| | |
|---|---|
| G06F 13/16 | (2006.01) |
| G11C 16/04 | (2006.01) |
| G11C 16/10 | (2006.01) |
| G11C 16/26 | (2006.01) |
| G11C 16/08 | (2006.01) |

(52) U.S. Cl.
CPC ...... *G06F 13/1668* (2013.01); *G11C 16/0483* (2013.01); *G11C 16/10* (2013.01); *G11C 16/26* (2013.01); *G11C 16/08* (2013.01)

(58) Field of Classification Search
CPC .................................................... G06F 13/1668
See application file for complete search history.

(56) References Cited

U.S. PATENT DOCUMENTS

| | | | |
|---|---|---|---|
| 10,998,061 B1 * | 5/2021 | Tsai ....................... | G11C 16/32 |
| 2020/0090779 A1 | 3/2020 | Tokutomi et al. | |
| 2020/0273523 A1 | 8/2020 | Donati et al. | |

FOREIGN PATENT DOCUMENTS

JP    2003-030613 A    1/2003

\* cited by examiner

*Primary Examiner* — David E Martinez
(74) *Attorney, Agent, or Firm* — Kim & Stewart LLP

(57) ABSTRACT

A semiconductor storage device includes a memory cell array and first and second circuits. The memory cell array is configured to store data in a non-volatile manner. The first circuit is configured to detect a first signal from an external device that is external to the semiconductor storage device. The first signal is required when the external device communicates with the semiconductor storage device in accordance with a first interface protocol, and not required when the external device communicates with the semiconductor storage device in accordance with a second interface protocol different from the first interface protocol. The second circuit is configured to generate a second signal in a first state when the first circuit detects the first signal and in a second state when the first circuit does not detect the first signal, the second state being different from the first state.

9 Claims, 9 Drawing Sheets

FIG. 3

| NOTATION | SIGNAL NAME | FIRST INTERFACE METHOD | SECOND INTERFACE METHOD | THIRD INTERFACE METHOD |
|---|---|---|---|---|
| DQ[7:0] | Data input/output | ○ | ○ | ○ |
| CLE | Command Latch Enable | ○ | ○ | ○ |
| ALE | Address Latch Enable | ○ | ○ | ○ |
| CEn | Chip Enable | ○ | ○ | ○ |
| REn | Read Enable | ○ | ○ | ○ |
| RE | Read Enable Complement | ○ | - | - |
| WEn | Write Enable | ○ | ○ | ○ |
| WPn | Write Protect | ○ | ○ | ○ |
| RY/Bn | Ready/Busy Output | ○ | ○ | ○ |
| DQS | Data Strobe | ○ | ○ | - |
| DQSn | Data Strobe Complement | ○ | - | - |

FIG. 4

| | DQ0 | DQ1 | DQ2 | DQ3 | DQ4 | DQ5 | DQ6 | DQ7 |
|---|---|---|---|---|---|---|---|---|
| Definition of value | Pass:"0" Fail:"1" | Pass:"0" Fail:"1" | Reserved | Reserved | Reserved | Busy:"0" Ready:"1" | Busy:"0" Ready:"1" | Protected:"0" Not Protected:"1" |
| Block Erase | Pass/Fail | Not Use | Not Use | Not Use | Not Use | Not Use | Busy/Ready | Write protect |
| Page Program | Pass/Fail | Not Use | Not Use | Not Use | Not Use | Not Use | Busy/Ready | Write protect |
| Cache Program | Pass/Fail for the current page | Pass/Fail for the previous page | Not Use | Not Use | Not Use | Busy/Ready for Flash array | Busy/Ready for Host | Write protect |
| Read | Not Use | Not Use | Not Use | Not Use | Not Use | Not Use | Busy/Ready | Write protect |
| Cache Read | Not Use | Not Use | Not Use | Not Use | Not Use | Busy/Ready for Flash array | Busy/Ready for Host | Write protect |
| Copy-Back | Pass/Fail | Not Use | Not Use | Not Use | Not Use | Not Use | Busy/Ready | Write protect |

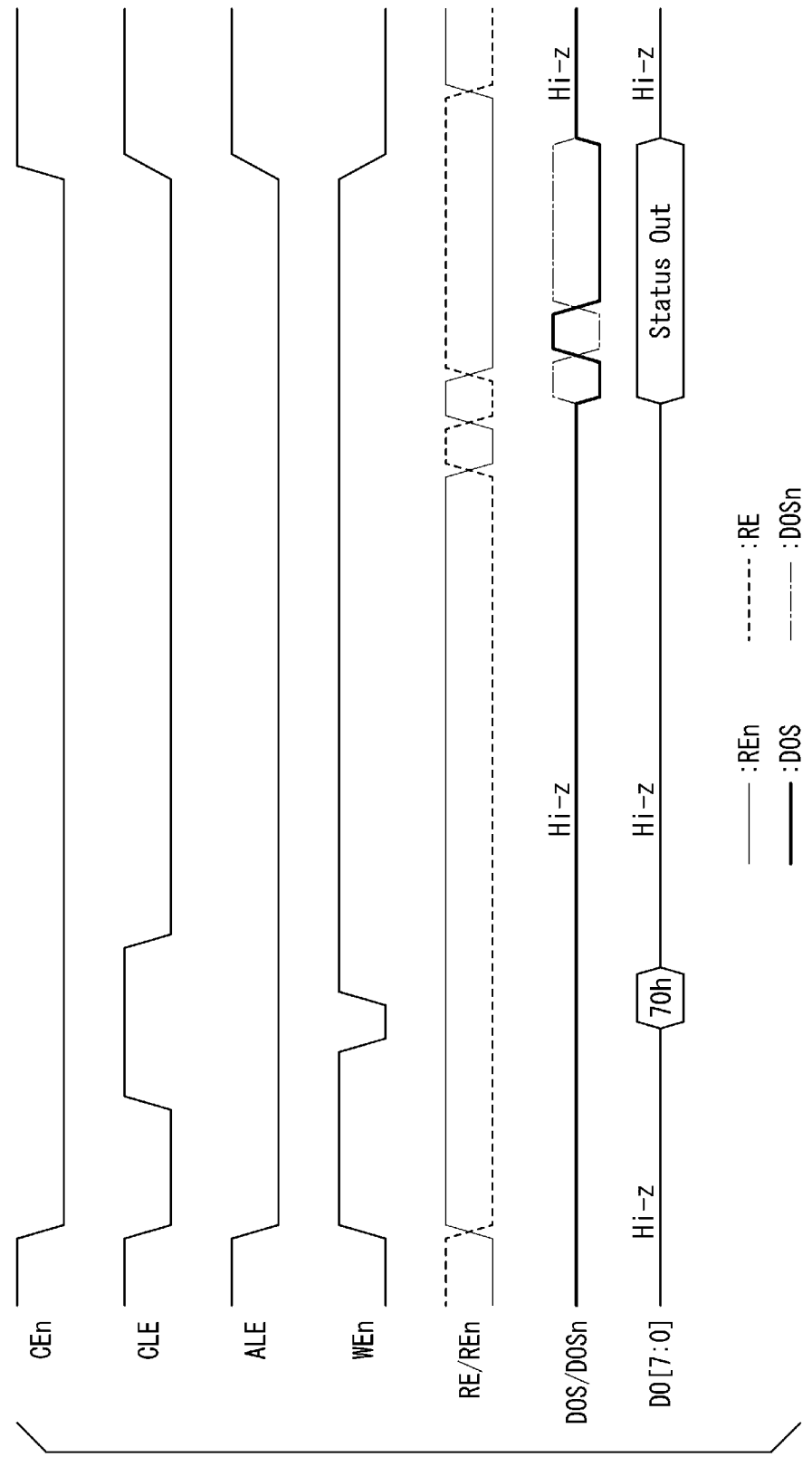

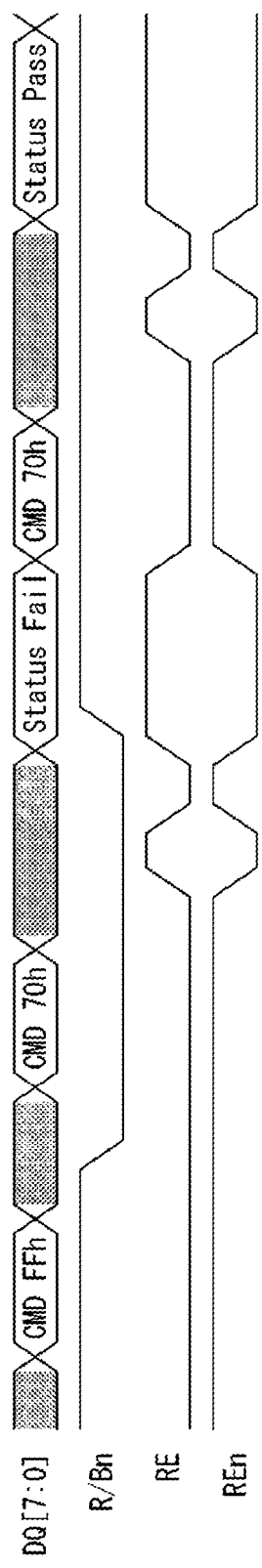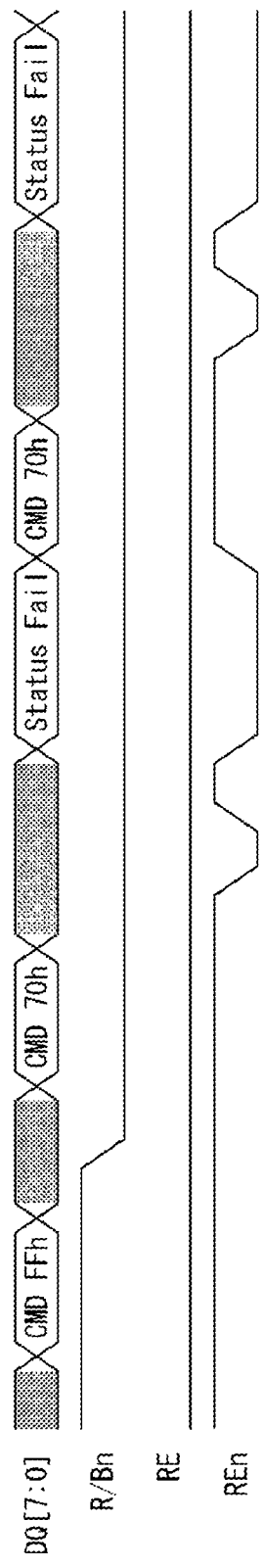

COMMUNICATION IN ACCORDANCE WITH MULTIPLE INTERFACE PROTOCOLS IN SEMICONDUCTOR STORAGE DEVICE

CROSS-REFERENCE TO RELATED APPLICATION

This application is based upon and claims the benefit of priority from Japanese Patent Application No. 2021-046108, filed Mar. 19, 2021, the entire contents of which are incorporated herein by reference.

FIELD

Embodiments described herein relate generally to a semiconductor storage device, a memory controller, and a memory system.

BACKGROUND

A memory controller and a semiconductor storage device connected using a various interface methods are known.

BRIEF DESCRIPTION OF THE DRAWINGS

FIG. 3 is a table illustrating signals used in several interface methods in an embodiment.

FIG. 4 is a table illustrating an example of status information used in an embodiment.

FIG. 5 is a timing chart illustrating output timing of status information in an embodiment.

FIG. 6 is a timing chart illustrating an operation example of a NAND device according to an embodiment.

FIG. 7 is a timing chart illustrating an operation example of a NAND device according to an embodiment.

DETAILED DESCRIPTION

Figure 1:
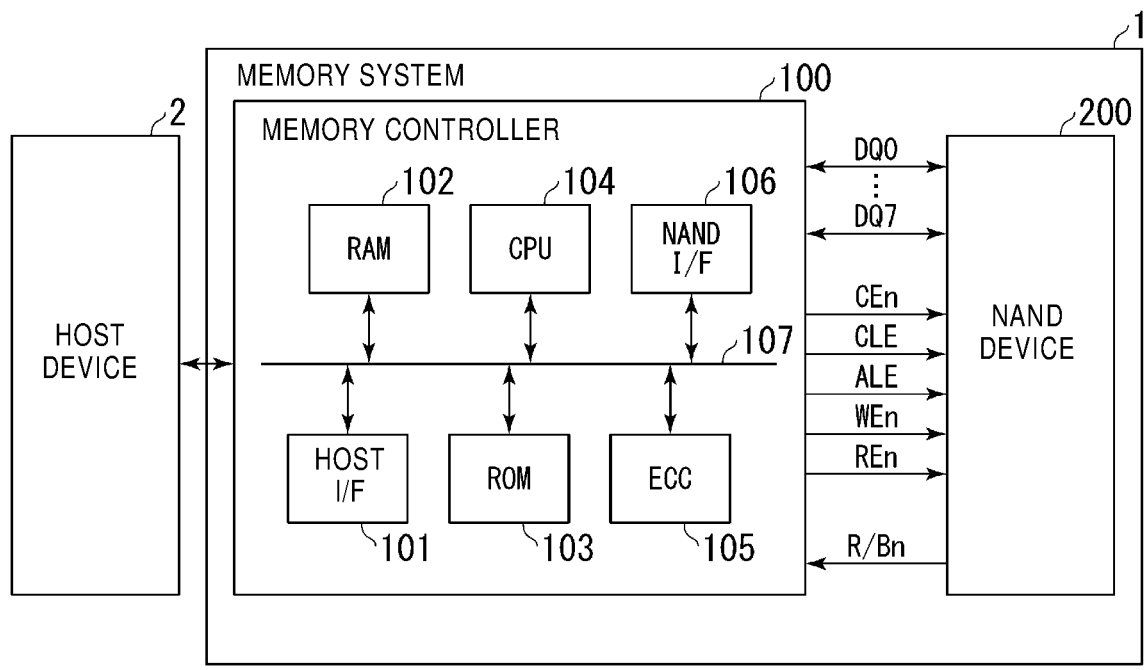
FIG. 1 is a block diagram illustrating a configuration of a memory system according to an embodiment.

Embodiments provide a semiconductor storage device, a memory controller, and a memory system with improved reliability.

In general, according to an embodiment, a semiconductor storage device includes a memory cell array and first and second circuits. The memory cell array is configured to store data in a non-volatile manner. The first circuit is configured to detect a first signal from an external device that is external to the semiconductor storage device. The first signal is required when the external device communicates with the semiconductor storage device in accordance with a first interface protocol, and not required when the external device communicates with the semiconductor storage device in accordance with a second interface protocol different from the first interface protocol. The second circuit is configured to generate a second signal in a first state when the first circuit detects the first signal and in a second state when the first circuit does not detect the first signal, the second state being different from the first state.

Hereinafter, a semiconductor storage device, a memory controller, and a memory system according to certain example embodiments will be described with reference to the accompanying drawings. In the following description, components having the same or similar functions are denoted by the same reference numerals. Redundant descriptions on such components may be omitted in some cases. In the following description, the phrase "based on XX" means "based on at least XX", and thus also includes a case in which another element in addition to "XX" is utilized. Furthermore, "based on XX" is not limited to cases where XX is directly used, but may also include cases in which something is based on a calculation or processing performed on or with "XX." In this context, "XX" is any aspect or element (e.g., any information).

In the following, reference to or description as having a "connection" or being connected to is not limited to a mechanical connection, and may also include a case of electrical connection. Additionally, "connection" is not limited in this context to cases of direct connection to another object or the like, but may also include a case where a connection is made via another element interposed between two.

The memory system includes a semiconductor storage device, and a memory controller that controls the semiconductor storage device. The semiconductor storage device and the memory controller are connected by using interface methods that match each other. There are a variety of interface methods for a semiconductor storage device and a memory controller. In some cases, the particular interface method set for the semiconductor storage device and the particular interface method set for the memory controller may not match each other. When the memory system operates in a state where the interface method of the semiconductor storage device and the interface method of the memory controller do not match each other, unexpected results may be caused.

Therefore, the semiconductor storage device of the present embodiment detects the presence/absence of a first signal sent from the memory controller when an interface method of the memory controller is a particular predetermined method. When the first signal is detected, the semiconductor storage device sets a second signal for the memory controller to a first state. If the first signal is not detected, the semiconductor storage device sets the second signal for the memory controller to a second state. Accordingly, improvement of reliability may be achieved. The present disclosure is not limited to the example embodiments described below.

(1. Entire Configuration of Memory System)

FIG. 1 is a block diagram illustrating a configuration of a memory system 1 according to an embodiment. The memory system 1 is, for example, one storage device, and may be connected to a host device 2. The memory system 1 functions as an external storage device of the host device 2. The host device 2 controls the memory system 1. The host device 2 is, for example, a server device, a personal computer, or a mobile information processing device. The host device 2 may issue an access request (e.g., a read request or a write request) to the memory system 1.

The memory system 1 includes, for example, a memory controller 100, and a plurality of NAND-type flash storage devices 200, though only one is specifically illustrated in FIG. 1. The NAND-type flash storage devices 200 will be referred to as "NAND devices 200". The memory controller 100 can be said to be "outside" of the NAND device 200 when viewed on the NAND device 200 side. In this respect, the memory controller 100 may be referred to as an external device that is external to the NAND device 200. Each NAND device 200 is an example of a "semiconductor storage device". Each NAND device 200 can be said to be "outside" of the memory controller 100 when viewed on the memory controller 100 side.

(2. Configuration of Memory Controller)

The memory controller 100 includes, for example, a host interface circuit 101 (host I/F 101), a random access memory (RAM) 102, a read only memory (ROM) 103, a central processing unit (CPU) 104, an error correcting code (ECC) circuit 105, and a NAND interface circuit 106 (NAND I/F 106). These components are connected to each other via a bus 107. For example, the memory controller 100 is configured as a system-on-a-chip (SoC) in which these components are integrated in one chip. In some examples, some of these components may be provided outside the memory controller 100.

The host I/F 101 executes a control of a communication interface between the host device 2 and the memory system 1, and a control of data transmission between the host device 2 and the RAM 102 under the control by the CPU 104.

The RAM 102 is, for example, a synchronous dynamic random access memory (SDRAM) or a static random access memory (SRAM), but is not limited thereto. The RAM 102 functions as a buffer for data transmission between the host device 2 and the NAND device 200. The RAM 102 provides the CPU 104 with a work area. When the memory system 1 operates, firmware (program) stored in the ROM 103 is loaded into the RAM 102.

The CPU 104 is an example of a hardware processor. The CPU 104 controls the operation of the memory controller 100 by executing, for example, firmware loaded in the RAM 102. For example, the CPU 104 controls operations related to writing, reading, and erasing of data to/from the NAND device 200.

The ECC circuit 105 performs an encoding for error correction, on data to be written into the NAND device 200. When data read from the NAND device 200 has an error, the ECC circuit 105 executes an error correction on the read data on the basis of the error correction code given during the write operation.

The NAND I/F 106 executes a control of the communication interface between the memory controller 100 and the NAND device 200, and a control of data transmission between the RAM 102 and the NAND device 200 under the control by the CPU 104. Various signals are transmitted/received between the memory controller 100 and the NAND device 200. These signals will be described below in detail.

(3. Configuration of NAND Device)

(3.1 Types of Signals)

Figure 2:
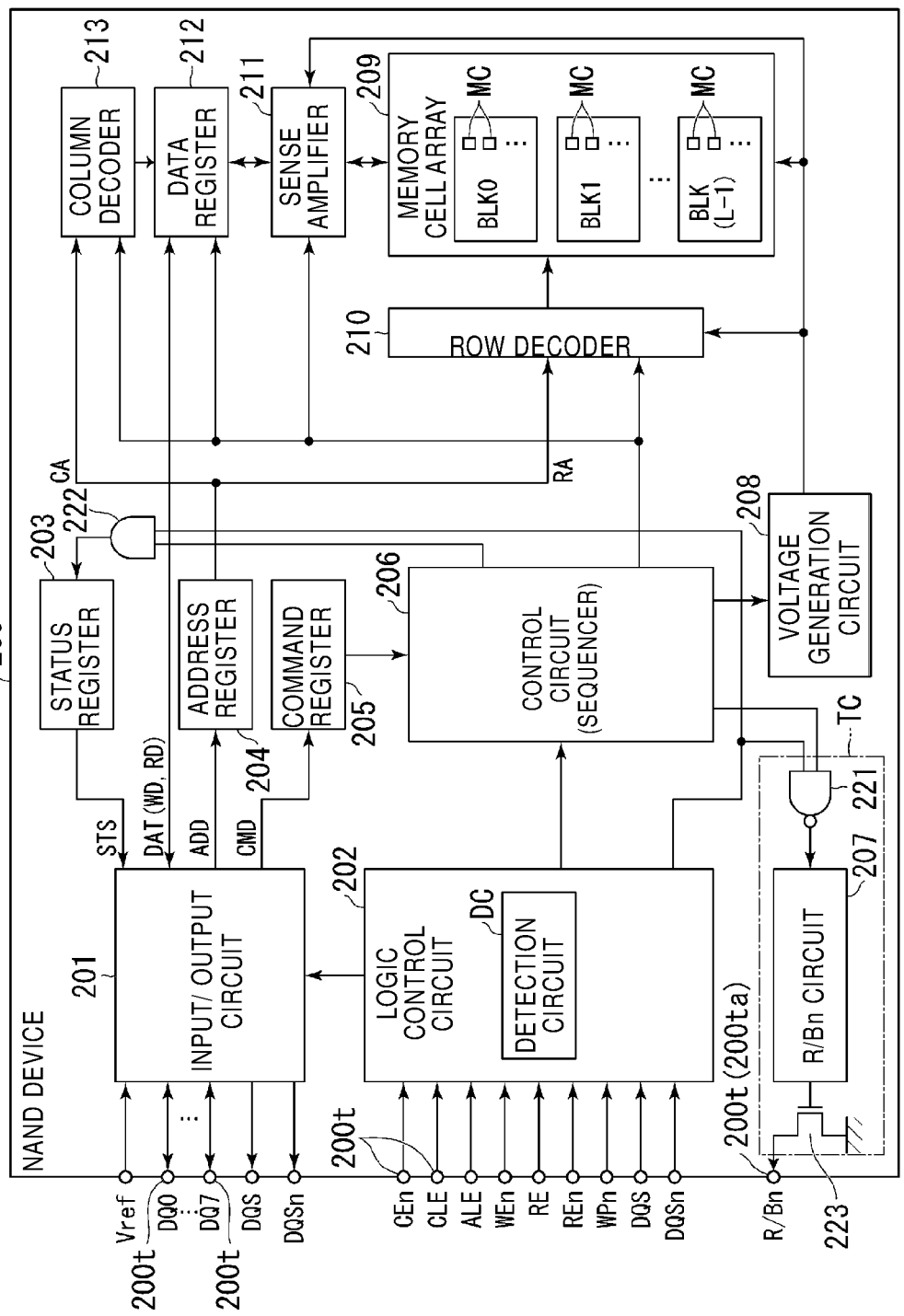
FIG. 2 is a block diagram illustrating a configuration of a NAND device according to an embodiment.

FIG. 2 is a block diagram illustrating a configuration of the NAND device 200.

As illustrated in FIG. 2, signals transmitted/received between the memory controller 100 and the NAND device 200 include data signals DQ (DQ0 to DQ7), data strobe signals DQS/DQSn transmitted from the NAND device 200, a chip enable signal CEn, a command latch enable signal CLE, an address latch enable signal ALE, a write enable signal WEn, read enable signals RE/REn, a write protect signal WPn, data strobe signals DQS/DQSn transmitted from the memory controller 100, and a ready/busy signal R/Bn. These signals are transmitted/received via individual transmission lines. A reference voltage Vref is supplied to the NAND device 200 from the memory controller 100. The voltage Vref is a reference voltage (a reference signal) having a constant value, which is used for timing specified voltages of the data signals DQ (DQ0 to DQ7), the data strobe signals DQS/DQSn, and the read enable signals RE/REn.

The data signals DQ include a signal indicating contents of data to be written into the NAND device 200 (hereinafter, referred to as "write data WD"), a signal indicating contents of data to be read from the NAND device 200 (hereinafter, referred to as "read data RD"), a signal indicating various commands CMD, and a signal indicating an address ADD of a write destination or a read destination of data. The data signals DQ of, for example, 8 bits are transmitted/received at a time, via eight transmission lines independent of each other.

The data strobe signals DQS/DQSn are strobe signals used for latching data signals DQ or outputting the data signals DQ, and are, for example, toggle pattern signals (hereinafter, referred to as "toggle signals"). The data strobe signals DQS/DQSn include a data strobe signal DQS and a data strobe signal DQSn. The data strobe signal DQS and the data strobe signal DQSn are a pair of signals having a complementary relationship. For example, the data strobe signal DQS is a positive logic data strobe signal. The data strobe signal DQSn is a negative logic data strobe signal having a logically inverted relationship with the data strobe signal DQS.

Here, each of the data strobe signal DQS and the data strobe signal DQSn may be a strobe signal for write data reception, a strobe signal for read data transmission, or a strobe signal for read data reception. The strobe signal for write data reception is a strobe signal that is output from the memory controller 100 to the NAND device 200, together with write data WD during write operation of the write data WD, and is used at a timing of when the write data WD is latched in the NAND device 200. The strobe signal for read data transmission is output from the memory controller 100 to the NAND device 200 in synchronization with read enable signals RE/REn (or a read enable signal RE) to be described below during read operation of read data RD, and is used in the NAND device 200 to receive the edge and to output the read data RD from the NAND device 200 to the memory controller 100. The strobe signal for read data reception is a strobe signal that is generated in the NAND device 200 during read operation of read data RD, is output together with the read data RD from the NAND device 200 to the memory controller 100, and is used at a timing when the read data RD is latched in the memory controller 100. In the following description, a case of description as "data strobe signals DQS/DQSn" indicates both the data strobe signal DQS and the data strobe signal DQSn.

The chip enable signal CEn is a signal that enables selection of the NAND device 200 as an access target among NAND devices 200, and is asserted when the NAND device 200 is selected. The chip enable signal CEn is asserted at, for example, the Low ("L") level.

The command latch enable signal CLE is a signal that enables a command CMD output from the memory controller 100 to the NAND device 200, to be latched by a command register 205 in the NAND device 200. The address latch enable signal ALE is a signal that enables an address ADD output from the memory controller 100 to the NAND device 200, to be latched by an address register 204 in the NAND device 200. The command latch enable signal CLE and the address latch enable signal ALE are asserted at, for example, the High ("H") level.

The write enable signal WEn is a signal that enables data (e.g., a command CMD or an address ADD) to be passed to the NAND device 200. The write enable signal WEn is asserted at, for example, the "L" level.

The read enable signals RE/REn are signals that enable data to be read from the NAND device 200. The read enable signals RE/REn include a read enable signal RE and a read enable signal REn. The read enable signal RE and the read enable signal REn are a pair of signals having a complementary relationship. For example, the read enable signal RE is a positive logic read enable signal. The read enable signal RE is asserted at, for example, the "H" level. The read enable signal REn is a negative logic read enable signal having a logically inverted relationship with the read enable signal RE. The read enable signal REn is asserted at, for example, the "L" level. In the present embodiment, the read enable signal REn is an example of each of a "first input signal" and a "first signal". The read enable signal RE is an example of a "second input signal". In the following description, a case of description as "read enable signals RE/REn" indicates both the read enable signal RE and the read enable signal REn.

The write protect signal WPn is a signal asserted when writing and erasing are prohibited. The write protect signal WPn is asserted at, for example, the "L" level.

The ready/busy signal R/Bn is a signal distinguishably indicating whether the NAND device 200 is in the ready state or the busy state. The "ready state" is a state where the NAND device 200 may accept a command CMD from the memory controller 100. The "busy state" is a state where the NAND device 200 cannot accept a command CMD from the memory controller 100. The ready/busy signal R/Bn is maintained in the first state when the NAND device 200 is in the ready state. The ready/busy signal R/Bn is maintained in the second state when the NAND device 200 is in the busy state. A voltage level or an impedance state is different between the first state and the second state. For example, the first state is a high impedance state. The second state is a low impedance state.

In the present embodiment, as will be described below, when the NAND device 200 includes an open-drain circuit and the voltage is pulled up by the memory controller 100, a ready/busy signal R/Bn capable of shifting to the first state and the second state is generated. In the present specification, the signal detected when the NAND device 200 includes an open-drain circuit, and the voltage is pulled up by the memory controller 100 is also called an output signal output from the NAND device 200. The ready/busy signal R/Bn is a signal whose state is shifted according to the state in the NAND device 200, and is an example of an "output signal" or a "second signal".

As illustrated in FIG. 2, the NAND device 200 includes a plurality of terminals 200t connected to the memory controller 100. These terminals 200t are terminals to/from which data signals DQ, data strobe signals DQS/DQSn, a chip enable signal CEn, a command latch enable signal CLE, an address latch enable signal ALE, a write enable signal WEn, read enable signals RE/REn, a write protect signal WPn, and a ready/busy signal R/Bn are input or output. A terminal 200ta in these terminals 200t is an output terminal from which the ready/busy signal R/Bn is output.

(3.2 Internal Configuration of NAND Device)

Next, the internal configuration of the NAND device 200 will be described.

As illustrated in FIG. 2, the NAND device 200 includes, for example, an input/output circuit 201, a logic control circuit 202, a status register 203, the address register 204, the command register 205, a control circuit (sequencer) 206, a ready/busy circuit 207, a voltage generation circuit 208, a memory cell array 209, a row decoder 210, a sense amplifier 211, a data register 212, and a column decoder 213.

The input/output circuit 201 controls input/output of data signals DQ between the memory controller 100 and the NAND device 200. For example, the input/output circuit 201 includes an input circuit and an output circuit. The input circuit receives data DAT (e.g., write data WD), an address ADD, and a command CMD from the memory controller 100. The input circuit outputs the received data DAT (e.g., write data WD) to the data register 212, outputs the received address ADD to the address register 204, and outputs the received command CMD to the command register 205. The output circuit outputs status information STS received from the status register 203, and data DAT (e.g., read data RD) received from the data register 212, to the memory controller 100. The output circuit outputs data strobe signals DQS/DQSn as the above-described strobe signals for read data reception, from the NAND device 200 to the memory controller 100. To the input/output circuit 201, a voltage Vref is supplied from the memory controller 100.

The logic control circuit 202 receives a chip enable signal CEn, a command latch enable signal CLE, an address latch enable signal ALE, a write enable signal WEn, read enable signals RE/REn, a write protect signal WPn, and data strobe signals DQS/DQSn from the memory controller 100. All of these signals are examples of signals which are received from the memory controller 100 in order to perform a control of the memory cell array 209. The data strobe signals DQS/DQSn received by the logic control circuit 202 include the above-described strobe signal for write data reception and the strobe signal for read data transmission. The logic control circuit 202 is connected to the ready/busy circuit 207 via, for example, a NAND element 221. The logic control circuit 202 is connected to the status register 203 via, for example, an AND element 222. The logic control circuit 202 controls the input/output circuit 201 and the control circuit 206 according to the received signals. The logic control circuit 202 includes a detection circuit DC that detects the read enable signals RE/REn. The detection circuit DC will be described below in detail. The detection circuit DC is an example of a "first circuit".

The status register 203 generates status information STS indicating the state of the NAND device 200, and temporarily stores the generated status information STS. The status information STS stored in the status register 203 is notified, as a part of the data signals DQ, to the memory controller 100 by the input/output circuit 201. Based on the status information STS, the memory controller 100 may recognize whether a write operation, a read operation, and an erase operation of data DAT are normally ended in the NAND device 200.

The address register 204 temporarily stores the address ADD received from the memory controller 100 via the input/output circuit 201. The address register 204 transmits a row address RA included in the stored address ADD to the row decoder 210, and transmits a column address CA included in the stored address ADD to the column decoder 213.

The command register 205 temporarily stores the command CMD received from the memory controller 100 via the input/output circuit 201. The command register 205 transmits the stored command CMD to the control circuit 206.

The control circuit 206 controls the entire operation of the NAND device 200. For example, the control circuit 206 controls the status register 203, the ready/busy circuit 207, the voltage generation circuit 208, the row decoder 210, the sense amplifier 211, the data register 212, and the column decoder 213 according to the command CMD stored in the command register 205. Through control of the above components, the control circuit 206 executes a write operation, a read operation, and an erase operation in the NAND device 200. The control circuit 206 is connected to the ready/busy circuit 207 via, for example, the NAND element 221. The control circuit 206 is connected to the status register 203 via, for example, the AND element 222.

The ready/busy circuit 207 generates a ready/busy signal R/Bn according to the operating status of the control circuit 206 and the result of signal detection by the logic control circuit 202. The ready/busy circuit 207 is connected to a gate terminal of, for example, an N-Channel Metal-Oxide Semiconductor (NMOS) transistor 223. A source of the NMOS transistor 223 is connected to the ground. That is, the NAND device 200 includes an open-drain circuit. A drain of the NMOS transistor 223 is connected to the terminal 200ta of the NAND device 200. The voltage of the terminal 200ta of the NAND device 200 is pulled up by the memory controller 100. Accordingly, the ready/busy circuit 207 outputs the generated ready/busy signal R/Bn from the terminal 200ta to the memory controller 100 via the NMOS transistor 223. That is, when the NAND device 200 is in the ready state, the ready/busy circuit 207 turns off the NMOS transistor 223 and outputs the ready/busy signal R/Bn in a high impedance state. When the NAND device 200 is in the busy state, the ready/busy circuit 207 turns on the NMOS transistor 223, and outputs the ready/busy signal R/Bn in the low impedance state. In the present embodiment, for example, the NAND element 221, the ready/busy circuit 207, and the NMOS transistor 223 constitute an example of an output circuit TC. The output circuit TC is an example of a "second circuit".

The voltage generation circuit 208 generates voltages required for a write operation, a read operation, and an erase operation according to the control of the control circuit 206. The voltage generation circuit 208 supplies the generated voltages to the memory cell array 209, the row decoder 210, and the sense amplifier 211. The row decoder 210 and the sense amplifier 211 apply the voltages supplied from the voltage generation circuit 208 to memory cell transistors in the memory cell array 209.

The memory cell array 209 includes a plurality of blocks BLK (BLK0, BLK1, . . . BLK(L-1)) (where L is an integer of 1 or more) including non-volatile memory cell transistors MC associated with rows and columns. Each block BLK stores data DAT in a non-volatile manner by the voltage applied by the row decoder 210. The memory cell transistor MC is an example of a "memory element".

The row decoder 210 decodes the row address RA. The row decoder 210 selects memory cell transistors in the memory cell array 209 on the basis of the decoding result of the row address RA. Then, the row decoder 210 applies a required voltage to the selected memory cell transistors.

The sense amplifier 211 senses the state of memory cell transistors in the memory cell array 209 during a read operation, and generates read data RD on the basis of the sensed state. The sense amplifier 211 stores the generated read data RD in the data register 212. The sense amplifier 211 stores write data WD in the memory cell array 209 during a write operation.

The data register 212 includes a plurality of latch circuits. The latch circuits temporarily store write data WD and read data RD. For example, during a write operation, the data register 212 temporarily stores write data WD received from the input/output circuit 201, and outputs the write data WD to the sense amplifier 211. During a read operation, the data register 212 temporarily stores read data RD received from the sense amplifier 211, and outputs the read data RD to the input/output circuit 201.

The column decoder 213 decodes the column address CA during a write operation, a read operation, and an erase operation. The column decoder 213 selects a latch circuit in the data register 212 according to the decoding result of the column address CA.

(4. Interface Method)

Next, several interface methods will be described.

FIG. 3 is a table illustrating signals used in several interface methods. An "interface method" may be referred to as an interface protocol. In FIG. 3, a read enable signal RE is referred to as a "read enable complement signal (Read Enable Complement)", and a data strobe signal DQSn is referred to as a "data strobe complement signal (Data Strobe Complement)". However, regardless of the above notation, the "read enable signal" in the present embodiment is not limited to a read enable signal REn, but may also correspond to a read enable signal RE. Likewise, the "data strobe signal" in the present embodiment is not limited to a data strobe signal DQS, but may also correspond to a data strobe signal DQSn.

In the present embodiment, any one of the following three interface methods can be utilized as an interface method of the memory controller 100 or an interface method of the NAND device 200. For example, as for the interface method of the NAND device 200, any single one of the following three described interface methods can be exclusively set for each NAND device 200, at least once the NAND device 200 is powered on. For the interface method of the memory controller 100 any single one of the following three described interface methods can be selected by the control of the memory controller 100. The selection among the interface methods is changeable by the control of the memory controller 100.

(4.1 First Interface Method)

The first interface method is, for example, an interface method using a double data rate (DDR), in which the output values of data signals DQ are updated at each of the rising edge and the falling edge of each cycle included in a toggle signal. According to the first interface method, data signals DQ, a command latch enable signal CLE, an address latch enable signal ALE, a chip enable signal CEn, read enable signals RE/REn, a write enable signal WEn, a write protect signal WPn, a ready/busy signal R/Bn, and data strobe signals DQS/DQSn are transmitted/received between the memory controller 100 and the NAND device 200.

(4.2 Second Interface Method)

The second interface method is, for example, an interface method as another method (a second method) using a double data rate (DDR), in which the output values of data signals DQ are updated at each of the rising edge and the falling edge of each cycle included in a toggle signal. According to the second interface method, data signals DQ, a command latch enable signal CLE, an address latch enable signal ALE, a chip enable signal CEn, a read enable signal REn, a write enable signal WEn, a write protect signal WPn, a ready/busy signal R/Bn, and a data strobe signal DQS are transmitted/received between the memory controller 100 and the NAND device 200. In the second interface method, a read enable signal RE and a data strobe signal DQSn are not transmitted/received.

(4.3 Third Interface Method)

The third interface method is, for example, an interface method using a single data rate (SDR) in which the output values of data signals DQ are updated at the rising edge (or the falling edge) of each cycle of a read enable signal REn. According to the third interface method, data signals DQ, a command latch enable signal CLE, an address latch enable signal ALE, a chip enable signal CEn, a read enable signal REn, a write enable signal WEn, a write protect signal WPn, and a ready/busy signal R/Bn are transmitted/received between the memory controller 100 and the NAND device 200. In the third interface method, a read enable signal RE and data strobe signals DQS/DQSn are not transmitted/received.

(5. Operation of NAND Device according to Difference in Interface Method)

Next, by referring back to FIG. 2, the operation of the NAND device according to a difference in the interface method will be described. The NAND device 200 of the present embodiment changes the state of the output signal of the NAND device 200 according to the interface method of the memory controller 100. For example, the NAND device 200 sets the output signal for the memory controller 100 (e.g., a ready/busy signal R/Bn) as the first state (e.g., a ready state) when a predetermined input signal (e.g., a read enable signal RE) is detected by the detection circuit DC, and sets the output signal for the memory controller 100 as the second state (e.g., a busy state) different from the first state when the predetermined input signal is not detected by the detection circuit DC. Hereinafter, these contents will be described.

(5.1 Operation Related to Ready/Busy Signal R/Bn)

As illustrated in FIG. 2, the logic control circuit 202 includes the detection circuit DC. The detection circuit DC detects the presence/absence of a read enable signal RE received from the memory controller 100. The read enable signal RE is a signal that is received from the memory controller 100 at least at a predetermined timing when the interface method of the memory controller 100 is a predetermined method (a first interface method). If the interface method of the memory controller 100 is not the predetermined method (e.g., is a second interface method or a third interface method instead of the first interface method), the read enable signal RE is not received from the memory controller 100 at least not at the predetermined timing or is a signal that can be ignored even if the signal is received. In this context, "ignored" means, for example, not being detected by the detection circuit DC. Additionally, "ignored" may also mean that even if a signal is detected by the detection circuit DC, the detection result is not output from the detection circuit DC, or that the detection result of the detection circuit DC is not recognized by the logic control circuit 202.

The detection circuit DC inputs a signal indicating the detection result of the presence/absence of the read enable signal RE at least at the above predetermined timing, to the ready/busy circuit 207 via the NAND element 221. For example, when the read enable signal RE is detected, the detection circuit DC inputs a signal corresponding to "1" to a first input terminal of the NAND element 221. If the read enable signal RE is not detected, the detection circuit DC inputs a signal corresponding to "0" to the first input terminal of the NAND element 221.

In the present embodiment, the detection circuit DC detects the presence/absence of the read enable signal RE received from the memory controller 100. For example, when the read enable signal RE is detected, the detection circuit DC inputs a signal corresponding to "1" to the first input terminal of the NAND element 221. If the read enable signal RE is not detected, the detection circuit DC inputs a signal corresponding to "0" to the first input terminal of the NAND element 221. The NAND device 200 may maintain this state as long as the power-supply voltage is in an operating range of the NAND device 200, and may also set the detection circuit DC to a disabled state.

Here, when the control circuit 206 may accept a command CMD from the memory controller 100, the control circuit 206 inputs a signal corresponding to "1" to a second input terminal of the NAND element 221. When the control circuit 206 cannot accept the command CMD from the memory controller 100 because processing in the NAND device 200 is in progress, the control circuit 206 inputs a signal corresponding to "0" to the second input terminal of the NAND element 221. Thus, only if the read enable signal RE is detected by the detection circuit DC and the command CMD from the memory controller 100 may be accepted by the control circuit 206, does the NAND element 221 output a signal corresponding to "0" to the ready/busy circuit 207. In all other cases, the NAND element 221 outputs a signal corresponding to "1" to the ready/busy circuit 207.

The ready/busy circuit 207 receives the detection result obtained when the presence/absence of the read enable signal RE is detected by the detection circuit DC, via the NAND element 221. For example, when the read enable signal RE is detected by the detection circuit DC and the command CMD from the memory controller 100 may be accepted by the control circuit 206 (e.g., when a signal corresponding to "0" is received from the NAND element 221), the ready/busy circuit 207 outputs a signal in the "H" level to a gate terminal of the NMOS transistor 223 and turns off the NMOS transistor 223. As a result, the output circuit TC maintains the terminal 200*ta* of the NAND device 200 in a high impedance state for at least a certain period of time. In this manner, the output circuit TC outputs a ready/busy signal R/Bn indicating the ready state of the NAND device 200.

If the read enable signal RE is not detected by the detection circuit DC (e.g., when a signal corresponding to "1" is received from the NAND element 221), the ready/busy circuit 207 outputs a signal in the "L" level to the gate terminal of the NMOS transistor 223, and thus turns on the NMOS transistor 223. As a result, the output circuit TC maintains the terminal 200*ta* of the NAND device 200 in a low impedance state for at least a certain period of time. In this manner, the output circuit TC outputs a ready/busy signal R/Bn indicating the busy state of the NAND device 200. The "certain period of time" is, for example, a time longer than the time when the processing of the memory controller 100 in regard to connection to the NAND device 200 is ended by timeout.

In the present embodiment, even when the read enable signal RE is detected by the detection circuit DC, when the command CMD from the memory controller 100 cannot be accepted by the control circuit 206 (e.g., when a signal corresponding to "1" is received from the NAND element 221), the ready/busy circuit 207 outputs a signal in the "L" level to the gate terminal of the NMOS transistor 223, and turns on the NMOS transistor 223. As a result, the output circuit TC maintains the terminal 200*ta* of the NAND device 200 in a low impedance state for at least a certain period of time. That is, the output circuit TC outputs a ready/busy signal R/Bn indicating the busy state of the NAND device 200.

(5.2 Operation Related to Status Information STS)

In the present embodiment, the detection circuit DC inputs a signal indicating the detection result of the presence/absence of the read enable signal RE at least at the above predetermined timing, to the status register 203 via the AND element 222. For example, when the read enable signal RE is detected, the detection circuit DC inputs a signal corresponding to "1" to a first input terminal of the AND element 222. When the read enable signal RE is not detected, the detection circuit DC sends a signal corresponding to "0" to the first input terminal of the AND element 222.

As described above, in the present embodiment, the detection circuit DC detects the read enable signal RE received from the memory controller 100. For example, when the read enable signal RE is detected, the detection circuit DC inputs a signal corresponding to "1" to the first input terminal of the AND element 222.

Here, when the control circuit 206 may accept a command CMD from the memory controller 100, the control circuit 206 inputs a signal corresponding to "1" to a second input terminal of the AND element 222. If the control circuit 206 cannot accept the command CMD from the memory controller 100 because processing in the NAND device 200 is in progress, the control circuit 206 sends a signal corresponding to "0" to the second input terminal of the AND element 222. Thus, only when the read enable signal RE is detected by the detection circuit DC and the command CMD from the memory controller 100 may be accepted by the control circuit 206, does the AND element 222 output a signal corresponding to "1" to the status register 203. In other cases, the AND element 222 outputs a signal corresponding to "0" to the status register 203.

The status register 203 receives the detection result obtained when the presence/absence of the read enable signal RE is detected by the detection circuit DC, via the AND element 222. For example, when the read enable signal RE is detected by the detection circuit DC and the command CMD from the memory controller 100 may be accepted by the control circuit 206 (e.g., when a signal corresponding to "1" is received from the AND element 222), the status register 203 generates status information STS indicating that the NAND device 200 is in the ready state, and outputs the generated status information STS to the input/output circuit 201. In this case, the input/output circuit 201 outputs the status information STS indicating that the NAND device 200 is in the ready state, to the memory controller 100. That is, the input/output circuit 201 outputs Status PASS indicating that a connection state is normal, to the memory controller 100.

If the read enable signal RE is not detected by the detection circuit DC (e.g., when a signal corresponding to "0" is received from the AND element 222), the status register 203 generates status information STS indicating that a connection state is not normal. In this case, the input/output circuit 201 outputs a Status FAIL indicating that the connection state is not normal to the memory controller 100.

In the present embodiment, even when the read enable signal RE is detected by the detection circuit DC, if the command CMD from the memory controller 100 cannot be accepted by the control circuit 206 (e.g., when a signal corresponding to "0" is received from the AND element 222), the status register 203 still generates status information STS corresponding to Status FAIL. Then, the input/output circuit 201 outputs a Status FAIL indicating that a connection state is not normal to the memory controller 100.

Alternatively, when the read enable signal RE is not detected by the detection circuit DC (e.g., when a signal corresponding to "0" is received from the AND element 222), the status register 203 may generate status information STS indicating that the NAND device 200 is in the busy state. In this case, the input/output circuit 201 may output the status information STS indicating that the NAND device 200 is in the busy state, to the memory controller 100. When the read enable signal RE is detected by the detection circuit DC and the command CMD from the memory controller 100 cannot be accepted by the control circuit 206 (when a signal corresponding to "0" is received), the status register 203 may generate status information STS indicating that the NAND device 200 is in the busy state. In this case, the input/output circuit 201 may output the status information STS indicating that the NAND device 200 is in the busy state to the memory controller 100.

FIG. 4 is a table illustrating an example of status information STS output by the NAND device 200. In the present embodiment, the input/output circuit 201 outputs information indicating the state of the NAND device 200, as status information STS for each operation through data signals DQ0 to DQ7. FIG. 4 is an example in which whether the NAND device 200 is in a ready state is indicated by using the data signal DQ6 included in the data signals D0 to DQ7 (see the contour line F in FIG. 4).

FIG. 5 is a timing chart illustrating output timing of status information STS. For example, when a predetermined command (a command "70$h$" in the example illustrated in FIG. 5) is received from the memory controller 100, and read enable signals RE/REn are received from the memory controller 100, the NAND device 200 outputs status information STS. Along with the output of the status information STS, the NAND device 200 simultaneously outputs data strobe signals DQS/DQSn as strobe signals for read data reception.

(5.3 Operation Example of NAND Device)

FIG. 6 and FIG. 7 are timing charts illustrating operation examples of the NAND device 200.

FIG. 6 illustrates a case where the interface method of the memory controller 100 is set to a first interface method, and after the power-ON operation of the NAND device 200 is completed, the NAND device 200 receives read enable signals RE/REn in relation to receiving a predetermined command from the memory controller 100.

As illustrated in FIG. 6, after the power-ON operation of the NAND device 200 is completed, first, the memory controller 100 outputs a first predetermined command (a command "FFh" in the example illustrated in FIG. 6), to the NAND device 200 through a data signal DQ. The first predetermined command is a command for shifting the NAND device 200 to an operating state. When the corresponding NAND device 200 is shifted to an operating state, the NAND device 200 places a ready/busy signal R/Bn in the busy state.

Subsequently, the memory controller 100 outputs a second predetermined command (a command "70$h$" in the example illustrated in FIG. 6), to the NAND device 200 through the data signal DQ. The second predetermined command is a command that requests the NAND device 200 to output status information STS of the NAND device 200 to the memory controller 100. The memory controller 100 outputs read enable signals RE/REn to the NAND device 200 in relation to outputting the second predetermined command.

As a result, after the power-ON operation of the corresponding NAND device 200 is completed, the NAND device 200 receives the read enable signals RE/REn from the memory controller 100 in relation to receiving the second predetermined command. In this case, the NAND device 200 switches the ready/busy signal R/Bn from the busy state to the ready state. In this case, the NAND device 200 maintains the ready/busy signal R/Bn in the ready state except when a command CMD from the memory controller 100 cannot be accepted.

FIG. 6 illustrates a case where in regard to the second predetermined command received from the memory controller 100, the inside of the NAND device 200 is not normally activated immediately after the power-ON operation of the NAND device 200 is completed, and status information STS cannot yet be output. In this case, again, the memory controller 100 outputs the second predetermined command to the NAND device 200, and outputs read enable signals RE/REn to the NAND device 200. When the second predetermined command is received from the memory controller 100, the NAND device 200 generates status information STS, and outputs the status information STS to the memory controller 100 through the data signal DQ. After the inside of the NAND device 200 is normally activated, the status information STS includes information indicating that a normal state is made, and the NAND device 200 is in the ready state.

FIG. 7 illustrates a case where the interface method of the memory controller 100 does not correspond to the first interface method, and after the power-ON operation of the NAND device 200 is completed, the NAND device 200 does not receive a read enable signal RE in relation to receiving a predetermined command from the memory controller 100.

As illustrated in FIG. 7, after the power-ON operation of the NAND device 200 is completed, first, the memory controller 100 outputs a first predetermined command (a command "FFh" in the example illustrated in FIG. 7), to the NAND device 200 through a data signal DQ. Next, the memory controller 100 outputs a second predetermined command (a command "70$h$" in the example illustrated in FIG. 7), to the NAND device 200 through the data signal DQ. The memory controller 100 outputs a read enable signal REn, but does not output a read enable signal RE in relation to outputting the second predetermined command.

As a result, after the power-ON operation of the corresponding NAND device 200 is completed, the NAND device 200 receives the read enable signal REn but does not receive the read enable signal RE in relation to receiving the second predetermined command from the memory controller 100. In this case, the NAND device 200 maintains a ready/busy signal R/Bn in a busy state.

FIG. 7 illustrates a case where in regard to the second predetermined command received from the memory controller 100, the inside of the NAND device 200 is not normally activated immediately after the power-ON operation of the NAND device 200 is completed, and status information STS cannot yet be output. In this case, again, the memory controller 100 outputs the second predetermined command to the NAND device 200, and outputs a read enable signal REn, but does not output a read enable signal RE. When the second predetermined command is received from the memory controller 100, the NAND device 200 outputs Status FAIL indicating that a connection state is not normal to the memory controller 100.

(6. Operation of Memory Controller)

Next, the operation of the memory controller 100 will be described.

Figure 8:
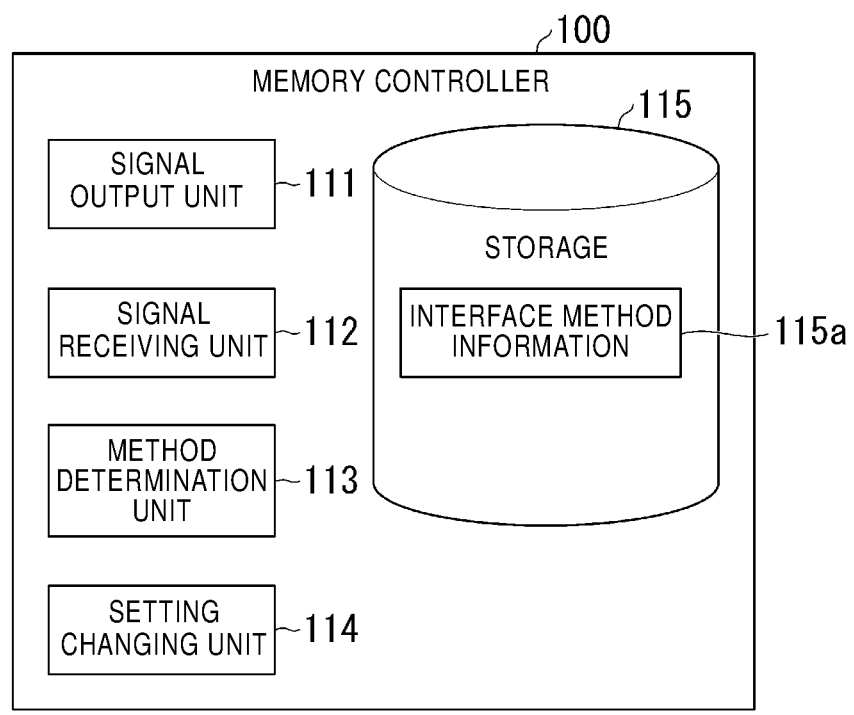
FIG. 8 is a block diagram illustrating a configuration of a memory controller according to an embodiment.

FIG. 8 is a block diagram illustrating a configuration of the memory controller 100. The memory controller 100 includes, for example, a signal output unit 111, a signal receiving unit 112, a method determination unit 113, a setting changing unit 114, and a storage 115. The signal output unit 111, the signal receiving unit 112, the method determination unit 113, and the setting changing unit 114 are implemented when a program (e.g., firmware) is executed by a hardware processor (e.g., the CPU 104). Alternatively, all or a part of these functional units may be implemented by a circuit (a circuitry) provided in the memory controller 100. The storage 115 is implemented by, for example, the above-described RAM 102 and ROM 103.

The signal output unit 111 controls the NAND I/F 106 so as to output data signals DQ, data strobe signals DQS/DQSn (the above-described strobe signal for write data reception and the strobe signal for read data transmission), a chip enable signal CEn, a command latch enable signal CLE, an address latch enable signal ALE, a write enable signal WEn, read enable signals RE/REn, and a write protect signal WPn to the NAND device 200. For example, after the power-ON operation of the NAND device 200 is completed, the signal output unit 111 outputs a first predetermined command (e.g., a command "FFh"), and subsequently outputs a second predetermined command (e.g., a command "70$h$") and read enable signals RE/REn.

The signal receiving unit 112 controls the NAND I/F 106 so as to receive data signals DQ, data strobe signals DQS/DQSn, and a ready/busy signal R/Bn output from the NAND device 200.

The method determination unit 113 determines an interface method of the NAND device 200 on the basis of signals detected from the NAND device 200 by the signal receiving unit 112. The method determination unit 113 is an example of a "determination unit". For example, in response to read enable signals RE/REn output to the NAND device 200 by the signal output unit 111 by using a first interface method, when a ready/busy signal R/Bn indicating a ready state is detected from the NAND device 200, the method determination unit 113 detects the presence/absence of a data strobe signal DQSn detected by the signal receiving unit 112. Then, when the data strobe signal DQSn is detected, the method determination unit 113 determines that the interface method of the NAND device 200 is a first interface method. The data strobe signal DQSn (read data strobe signal) is an example of both a "third signal" and a "first data strobe signal".

In response to read enable signals RE/REn output to the NAND device 200 by the signal output unit 111 by using the first interface method, when a ready/busy signal R/Bn indicating a busy state is detected from the NAND device 200, the method determination unit 113 determines that the interface method of the NAND device 200 is not a first interface method. In this case, the method determination unit 113 detects the presence/absence of a data strobe signal DQS received by the signal receiving unit 112. When the data strobe signal DQS is detected, the method determination unit 113 determines that the interface method of the NAND device 200 is a second interface method. If the data strobe signal DQS is not detected, the method determination unit 113 determines that the interface method of the NAND device 200 is a third interface method. The data strobe signal DQS (read data strobe signal) is an example of both a "fourth signal" and a "second data strobe signal".

The setting changing unit 114 changes the setting of the interface method of the memory controller 100 so that the interface method of the memory controller 100 matches the interface method of the NAND device 200 as determined by the method determination unit 113.

For example, when the interface method of the memory controller 100 is the first interface method and the method determination unit 113 determines that the interface method of the NAND device 200 is also the first interface method, the setting changing unit 114 maintains the interface method of the memory controller 100 without changing.

When the interface method of the memory controller 100 is the first interface method and the method determination unit 113 determines that the interface method of the NAND device 200 is the second interface method, the setting changing unit 114 changes the interface method of the memory controller 100 from the first interface method to the second interface method. Likewise, when the interface method of the memory controller 100 is the first interface method and the method determination unit 113 determines that the interface method of the NAND device 200 is the third interface method, the setting changing unit 114 changes the interface method of the memory controller 100 from the first interface method to the third interface method.

Setting contents of each interface method are stored, as interface method information 115a, in the storage 115. The setting changing unit 114 changes the interface method of the memory controller 100 into the same interface method as the interface method of the NAND device 200 by referring to the interface method information 115a.

(7. Flow of Control of Memory System)

(7.1 Flow of Control of NAND Device)

Figure 9:
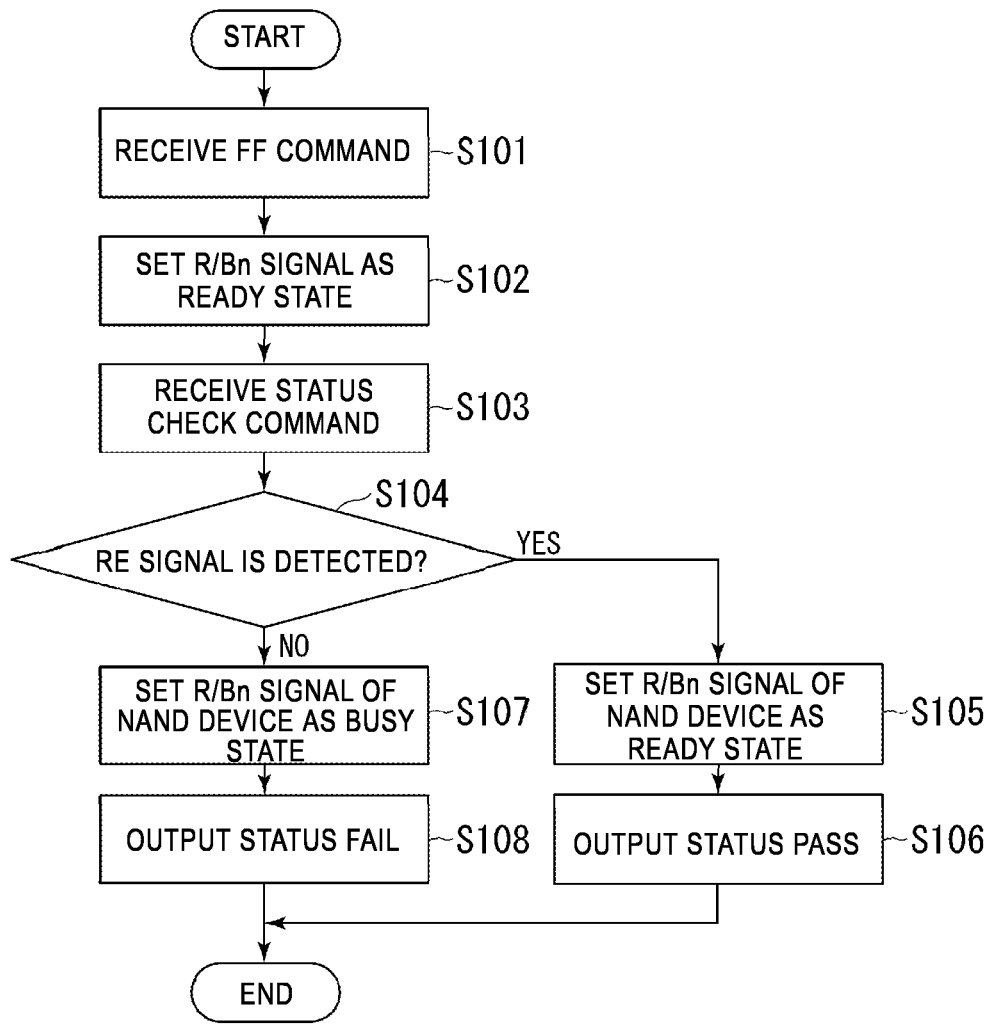
FIG. 9 is a flowchart illustrating control of a NAND device according to an embodiment.

FIG. 9 is a flowchart illustrating a flow of the control of the NAND device 200. After the power-ON operation of the corresponding NAND device 200 is completed, first, the input/output circuit 201 of the NAND device 200 receives a first predetermined command (denoted by "FF command" in FIG. 9) from the memory controller 100 (S101). When the first predetermined command is received, the control circuit 206 of the NAND device 200 shifts the NAND device 200 to an operating state, and sets a ready/busy signal R/Bn as a busy state (S102).

Next, the input/output circuit 201 of the NAND device 200 receives a second predetermined command (denoted by "status check command" in FIG. 9) from the memory controller 100 (S103). In this case, the detection circuit DC of the NAND device 200 determines whether a read enable signal RE received from the memory controller 100 is detected (S104).

When it is determined that the read enable signal RE is detected by the detection circuit DC (S104: YES), the output circuit TC sets the ready/busy signal R/Bn as a ready state (S105). In this case, the status register 203 generates status information STS indicating that the NAND device 200 is in the ready state. Then, the input/output circuit 201 outputs Status PASS indicating that the connection state is normal. That is, the input/output circuit 201 outputs the status information STS generated by the status register 203, to the memory controller 100 (S106).

If it is determined that the read enable signal RE is not detected by the detection circuit DC (S104: NO), the output circuit TC sets the ready/busy signal R/Bn to a busy state (S107). In this case, the input/output circuit 201 outputs Status FAIL indicating that the connection state is not normal (S108).

(7.2 Flow of Control of Memory Controller)

Figure 10:
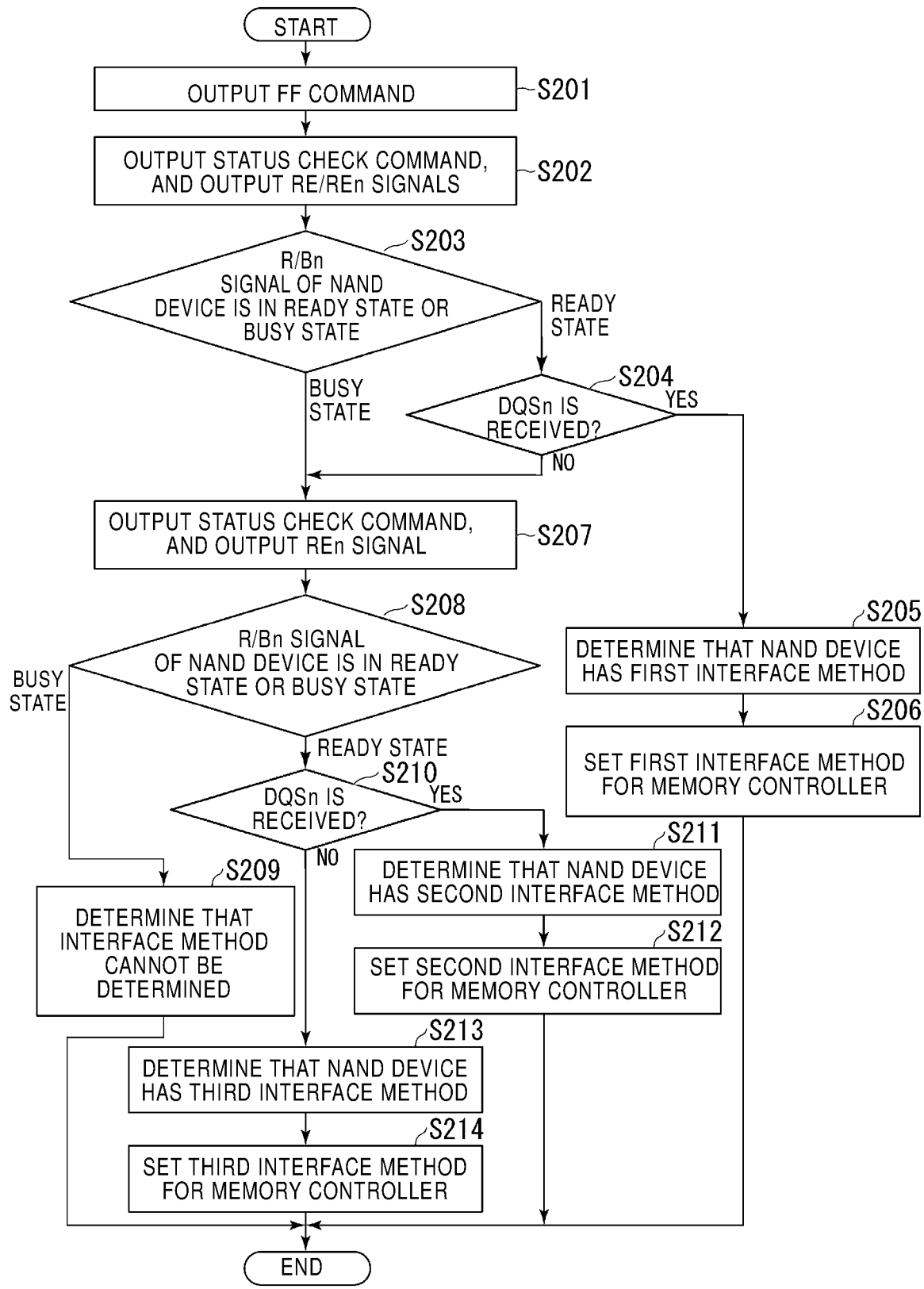
FIG. 10 is a flowchart illustrating control of a memory controller according to an embodiment.

FIG. 10 is a flowchart illustrating a flow of the control of the memory controller 100. In the description related to FIG. 10, the NAND device 200 is not limited to the NAND device 200 corresponding to a first interface method, and may be the NAND device 200 corresponding to a second interface method or a third interface method. In this case, the NAND device 200 may not include the detection circuit DC, the NAND element 221, and the AND element 222.

After the power-ON operation of the NAND device 200 is completed, first, the signal output unit 111 of the memory controller 100 outputs a first predetermined command (denoted by "FF command" in FIG. 10), to the NAND device 200 (S201). Then, the signal output unit 111 of the memory controller 100 outputs a second predetermined command (denoted by "status check command" in FIG. 10) to the NAND device 200, and outputs read enable signals RE/REn to the NAND device 200 (S202).

Next, the method determination unit 113 determines whether a ready/busy signal R/Bn, which is detected from the NAND device 200 in response to the read enable signals RE/REn output by using the first interface method, is in the ready state or the busy state (S203).

When it is determined that the ready/busy signal R/Bn is in the ready state (S203: ready state), the method determination unit 113 determines whether a data strobe signal DQSn is received from the NAND device 200 (S204). When it is determined that the data strobe signal DQSn is received from the NAND device 200 (S204: YES), the method determination unit 113 determines that the NAND device 200 has the first interface method (S205). In this case, the setting changing unit 114 sets the first interface method for the memory controller 100 (S206). In the present embodiment, "setting a first interface method" may also include a case where setting of the first interface method is already maintained.

If it is determined that the ready/busy signal R/Bn is in the busy state (S203: busy state) or when the data strobe signal DQSn is not received from the NAND device 200 (S204: NO), the process proceeds to S207.

In this case, the signal output unit 111 outputs the second predetermined command (denoted by "status check command" in FIG. 10) to the NAND device 200 again, and outputs a read enable signal REn to the NAND device 200 (S207). Then, the method determination unit 113 determines whether a ready/busy signal R/Bn, which is detected from the NAND device 200 in response to the read enable signal REn output by using the first interface method, is in the ready state or the busy state (S208).

When it is determined that the ready/busy signal R/Bn is in the busy state (S208: busy state), the method determination unit 113 determines that it is not possible to determine the interface method of the NAND device 200 (S209), and ends the process of this flow. If it is determined that the ready/busy signal R/Bn is in the ready state (S208: ready state), the method determination unit 113 proceeds to S210. In this case, the method determination unit 113 determines whether a data strobe signal DQS is received from the NAND device 200 (S210).

When it is determined that the data strobe signal DQS is received from the NAND device 200 (S210: YES), the method determination unit 113 determines that the NAND device 200 has the second interface method (S211). In this case, the setting changing unit 114 sets the second interface method for the memory controller 100 (S212). Then, the signal output unit 111 outputs the second predetermined command again so as to execute a connection operation for the NAND device 200.

If it is determined that the data strobe signal DQS is not received from the NAND device 200 (S210: NO), the method determination unit 113 determines that the NAND device 200 has the third interface method (S213). In this case, the setting changing unit 114 sets the third interface method for the memory controller 100 (S214). Then, the signal output unit 111 outputs the second predetermined command again so as to execute a connection operation for the NAND device 200.

(8. Advantages)

In recent years, as NAND devices become more advanced, the interfaces of the NAND devices has also become more advanced. Correspondingly, there are also a variety of interface methods of a memory controller. Thus, there are also a variety of potential combinations of interface methods of a NAND device and interface methods of a memory controller. Thus, the interface method of the NAND device may not match the interface method of the memory controller. When a memory system operates in a state where the interface method of the NAND device does not match the interface method of the memory controller, unexpected results may occur.

For example, when the memory controller has a second interface method and the NAND device has a first interface method, although first, both a read enable signal RE and a read enable signal REn are required to be input to the NAND device, the memory controller outputs only the read enable signal REn, and does not output the read enable signal RE. In this case, the NAND device may perform unexpected operations.

Therefore, in the present embodiment, the NAND device 200 includes the detection circuit DC, and the output circuit TC. The detection circuit DC detects the presence/absence of a first input signal (e.g., a read enable signal RE) that is received from the outside when the interface method of the outside is the first interface method but is not received from the outside when the interface method of the outside is the second interface method. The output circuit TC sets the output state of an output signal (e.g., a ready/busy signal R/Bn) for the outside to a first state when the first input signal is detected by the detection circuit DC, and sets the output state of the output signal to a second state, different from the first state, when the first input signal is not detected by the detection circuit DC. According to such a configuration, the memory controller 100 may determine whether the interface method of the NAND device 200 serving as a connection destination is a predetermined method. Accordingly, the memory system 1 may be prevented from operating in a state where the interface method of the NAND device 200 does not match the interface method of the memory controller 100. As a result, the reliability improvement may be achieved.

In the present embodiment, the NAND device 200 includes the terminal 200*ta* that may be connected to the outside and outputs the output signal. In the present embodiment, a voltage level or an impedance state in the terminal 200*ta* is different between the first state and the second state. According to such a configuration, the memory controller 100 may determine whether the interface method of the NAND device 200 is a predetermined method by detecting the voltage level or the impedance of the predetermined terminal 200*ta* of the NAND device 200. Accordingly, it is possible to more simply determine whether the interface method of the NAND device 200 is a predetermined method.

In the present embodiment, the output signal is a signal distinguishably indicating the ready state and the busy state of the NAND device 200. The first state is a state indicating a ready state. The second state is a state indicating a busy state. According to such a configuration, when the interface method of the NAND device 200 does not match the interface method of the memory controller 100, a signal indicating a busy state may be output from the NAND device 200. That is, it is possible to forcibly prevent the interaction from being performed between the NAND device 200 and the memory controller 100. Accordingly, the memory system 1 may be more reliably prevented from operating in a state where the interface method of the NAND device 200 does not match the interface method of the memory controller 100.

In the present embodiment, the detection circuit DC receives a first input signal (e.g., a read enable signal RE) and a second input signal (a read enable signal REn) received from the outside when the interface method of the outside is a predetermined method. The first input signal and the second input signal are signals having a logically inverted relationship with each other. According to such a configuration, by using a pair of complementary signals, it is possible to determine whether the interface method of the NAND device 200 is a predetermined method. Accordingly, it is possible to more reliably determine whether the interface method of the NAND device 200 is a predetermined method.

In the present embodiment, the first input signal is a read enable signal RE that enables data to be read from the NAND device 200. According to such a configuration, it is possible to determine whether the interface method of the NAND device 200 is a predetermined method by using the read enable signal RE without newly providing a special signal.

In the present embodiment, the detection circuit DC detects the presence/absence of the first input signal received in relation to receiving a predetermined command from the outside after the power-ON operation of the NAND device 200 is completed. According to such a configuration, it is possible to prevent the operation of the memory system 1 by using the input signal received before the operation related to the data processing of the NAND device 200 is started. Accordingly, the reliability may be further improved.

In the present embodiment, the memory controller 100 includes the setting changing unit 114. In response to a first signal (e.g., a read enable signal RE) output to the outside by using the first interface method, when a second signal (e.g., a ready/busy signal R/Bn) indicating a ready state is detected from the outside, the setting changing unit 114 maintains the interface method in use. In response to the first signal output to the outside by using the first interface method, when the second signal indicating a busy state is detected from the outside, the setting changing unit 114 changes the interface method to be used from the first interface method to another interface method. According to such a configuration, when the NAND device 200 is a NAND device 200 that cannot correspond to the first interface method, an attempt may be made to perform connection by using another interface method.

In the present embodiment, the memory controller 100 includes the method determination unit 113. In response to the first signal output to the outside by using the first interface method, when the second signal indicating a ready state is detected from the outside, the method determination unit 113 determines whether the interface method of the outside is the first interface method on the basis of the presence/absence of a third signal (e.g., a data strobe signal DQSn) different from the second signal. According to such a configuration, on the basis of not only the second signal, but also the third signal different from the second signal, it is determined whether the interface method of the outside is the first interface method. Accordingly, it is possible to more reliably determine whether the interface method of the outside is the first interface method. Thus, the reliability may be further improved.

In the present embodiment, the third signal is a data strobe signal DQSn used for reading data received from the outside. According to such a configuration, it is possible to determine whether the interface method of the NAND device 200 is a predetermined method by using the data strobe signal DQSn without newly providing a separate signal.

So far, the embodiment was described, but the contents of the embodiment are not limited to the above-described example. For example, the output signal whose state is changed by the output circuit according to the result obtained when the input signal is detected by the detection circuit is not limited to the ready/busy signal R/Bn, and may be a signal included in status information STS (e.g., a data signal DQ6). The output signal is not limited to the ready/busy signal R/Bn, and a write protect signal WPn may be used. The input signal detected by the detection circuit is not limited to a signal received in relation to a second predetermined command (a status check command), and may be a signal received in relation to another timing or another command. A "semiconductor storage device" is not limited to a NAND type flash storage device, and may be a magnetoresistive random access memory (MRAM), or a resistance change type or another type of storage device. That is, the "memory cell array" is not limited to those including memory cell transistors (memory elements) each of which stores data according to a stored charge, and may be those including memory elements each of which stores data according to a magnetic state or a resistance state.

According to at least one embodiment described above, a semiconductor storage device includes a first circuit and a second circuit. The first circuit detects presence/absence of a first signal received from the outside when the interface method of the outside is a predetermined method. The second circuit sets a second signal for the outside to a first state when the first signal is detected by the first circuit. The second circuit sets the second signal to a second state different from the first state when the first signal is not detected by the first circuit. According to such a configuration, the reliability improvement may be achieved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
a memory cell array configured to store data in a non-volatile manner;
a first circuit configured to detect a first signal from an external device, the first signal being required when the external device communicates with the semiconductor storage device in accordance with a first interface protocol, but not required when the external device communicates with the semiconductor storage device in accordance with a second interface protocol different from the first interface protocol;
a second circuit configured to generate a second signal in a first state when the first circuit detects the first signal and in a second state when the first circuit does not detect the first signal, the second state being different from the first state; and
a terminal connectable to the external device, wherein
the second signal in the first state causes the terminal to have a first voltage state or a first impedance state, and
the second signal in the second state causes the terminal to have a second voltage state different from the first voltage state or a second impedance state different from the first impedance state.

2. The semiconductor storage device according to claim 1, wherein
the second signal in the first state indicates a ready state of the semiconductor storage device, and
the second signal in the second state indicates a busy state of the semiconductor storage device.

3. The semiconductor storage device according to claim 2, further comprising:
a sequencer configured to generate a signal indicating whether the sequencer is ready to process a command, wherein
the second circuit includes a logic circuit having a first input terminal connected to the first circuit and a second input terminal connected to the sequencer, and
the logic circuit is configured to generate the second signal in the first state when the first circuit detects the first signal and the signal from the sequencer indicates that the sequencer is ready to process a command, and the second signal in the second state when the first circuit does not detect the first signal or the signal from the sequencer indicates that the sequencer is not ready to process a command.

4. The semiconductor storage device according to claim 1, wherein the first circuit is configured to receive a third signal from the external device when the external device communicates with the semiconductor storage device in accordance with either of a first interface protocol and a second interface protocol, the third signal being a logical inverse of the first signal.

5. The semiconductor storage device according to claim 1, wherein the first signal is a read enable signal.

6. The semiconductor storage device according to claim 1, wherein the first circuit is configured to start an operation to detect the first signal upon the semiconductor storage device receiving a predetermined command after a power-ON operation is completed.

7. The semiconductor storage device according to claim 6, wherein the predetermined command is a request for status information.

8. The semiconductor storage device according to claim 7, further comprising:
a third circuit configured to generate a status signal after the operation to detect the first signal, wherein
the status signal indicates a proper connection state between the semiconductor storage device and the external device when the first circuit detects the first signal during the operation and an improper connection state between the semiconductor storage device and the external device when the first circuit does not detect the first signal during the operation.

9. The semiconductor storage device according to claim 1, wherein the external device is a memory controller configured to communicate with a host device and the semiconductor storage device.

* * * * *